United States Patent
Okamoto et al.

(10) Patent No.: US 6,664,863 B1
(45) Date of Patent: Dec. 16, 2003

(54) LC OSCILLATOR

(75) Inventors: Akira Okamoto, Ageo (JP); Takeshi Ikeda, Tokyo (JP)

(73) Assignee: Niigata Seimitsu Co., Ltd.., Niigata (JP)

( * ) Notice: Subject to any disclaimer, the term of this patent is extended or adjusted under 35 U.S.C. 154(b) by 99 days.

(21) Appl. No.: 10/048,283

(22) PCT Filed: Jul. 24, 2000

(86) PCT No.: PCT/JP00/04927

§ 371 (c)(1),
(2), (4) Date: Jan. 24, 2002

(87) PCT Pub. No.: WO01/08290

PCT Pub. Date: Feb. 1, 2001

(30) Foreign Application Priority Data

Jul. 26, 1999 (JP) .......................................... 11/210167

(51) Int. Cl.⁷ ................................................ H03B 5/00
(52) U.S. Cl. ............... 331/117 R; 333/184; 331/108 D; 331/167
(58) Field of Search .................... 331/117 R, 108 D, 331/167; 333/184

(56) References Cited

U.S. PATENT DOCUMENTS 4,513,257 A    4/1985   Miyamoto et al.
5,705,963 A  * 1/1998   Ikeda et al. ................. 333/184

FOREIGN PATENT DOCUMENTS

| EP | 0 643 492 | 3/1995 |
|---|---|---|
| EP | 0 661 805 | 7/1995 |
| JP | 48-44755 | 6/1973 |
| JP | 3-117103 | 5/1991 |
| JP | 4-179158 | 6/1992 |
| JP | 6-84645 | 3/1994 |
| JP | 6-181417 | 6/1994 |
| JP | 6-268468 | 9/1994 |
| JP | 7-336137 | 12/1995 |
| JP | 7-336138 | 12/1995 |
| JP | 8-97373 | 4/1996 |
| JP | 8-203737 | 8/1996 |
| JP | 10-74624 | 3/1998 |
| JP | 11-317621 | 11/1999 |

OTHER PUBLICATIONS

Abidi et al. "Integrated Circuits For Wireless Communications" IEEE Press Marketing 1999 pp 456–457.*

* cited by examiner

Primary Examiner—Michael B. Shingleton
(74) Attorney, Agent, or Firm—Dellett and Walters

(57) ABSTRACT

An LC oscillator capable of oscillating even if it is fabricated on a substrate comprises a transistor, capacitor, and an inductor element 30. The inductor element 30 has two spiral conductors 120, 122 having substantially the same shape and formed on a semiconductor substrate 110. The inner end of the conductor 120 is electrically connected to the outer end of the conductor 122. Lead wires 130, 132 are connected to the outer and inner ends of the conductor 120 respectively. The lead wire 132 is passed through the lower conductor 122 and the semiconductor substrate 110 and led outside. The upper A conductor 120 serves as an inductor conductor and is connected to another component of the LC oscillator formed on the semiconductor substrate 110 through the lead wires 130, 132.

26 Claims, 16 Drawing Sheets

F/G. 1

F I G. 11
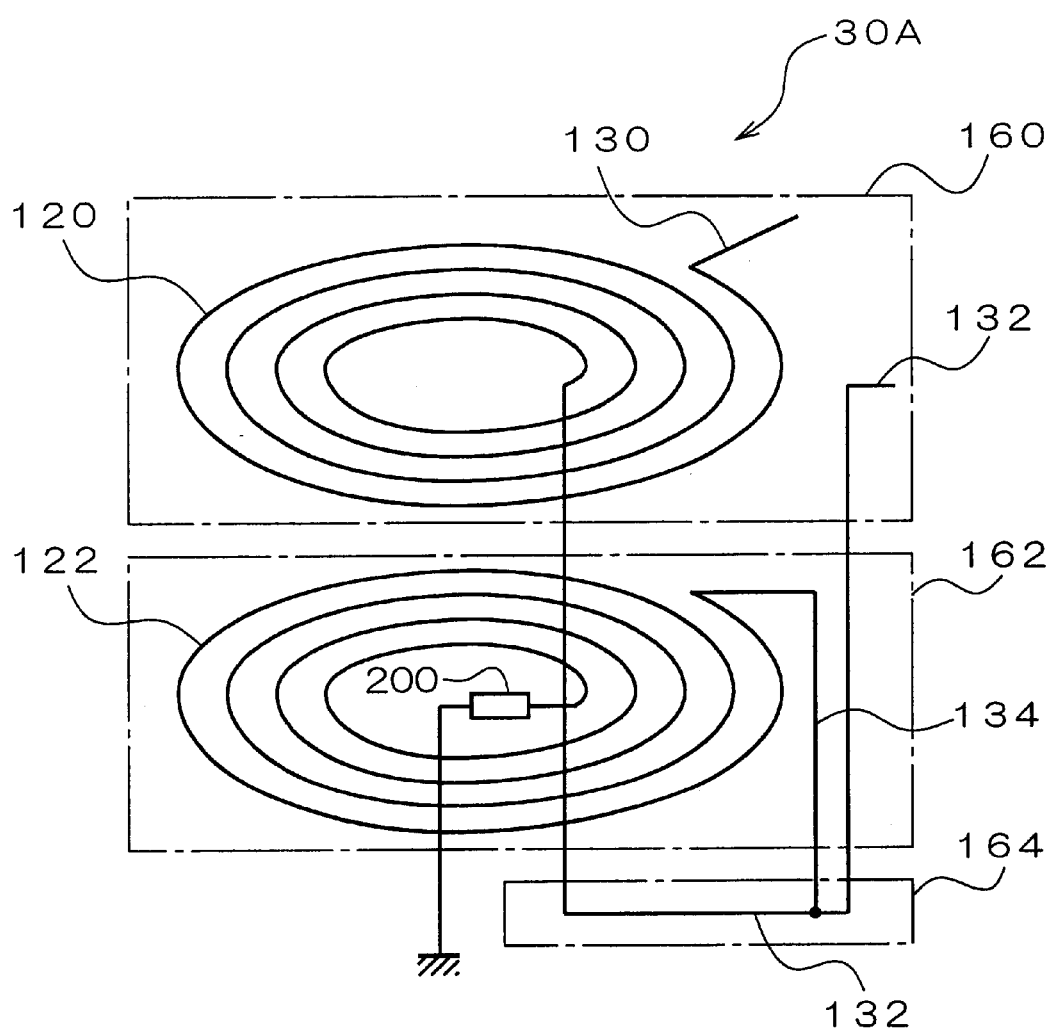

F/G. 15

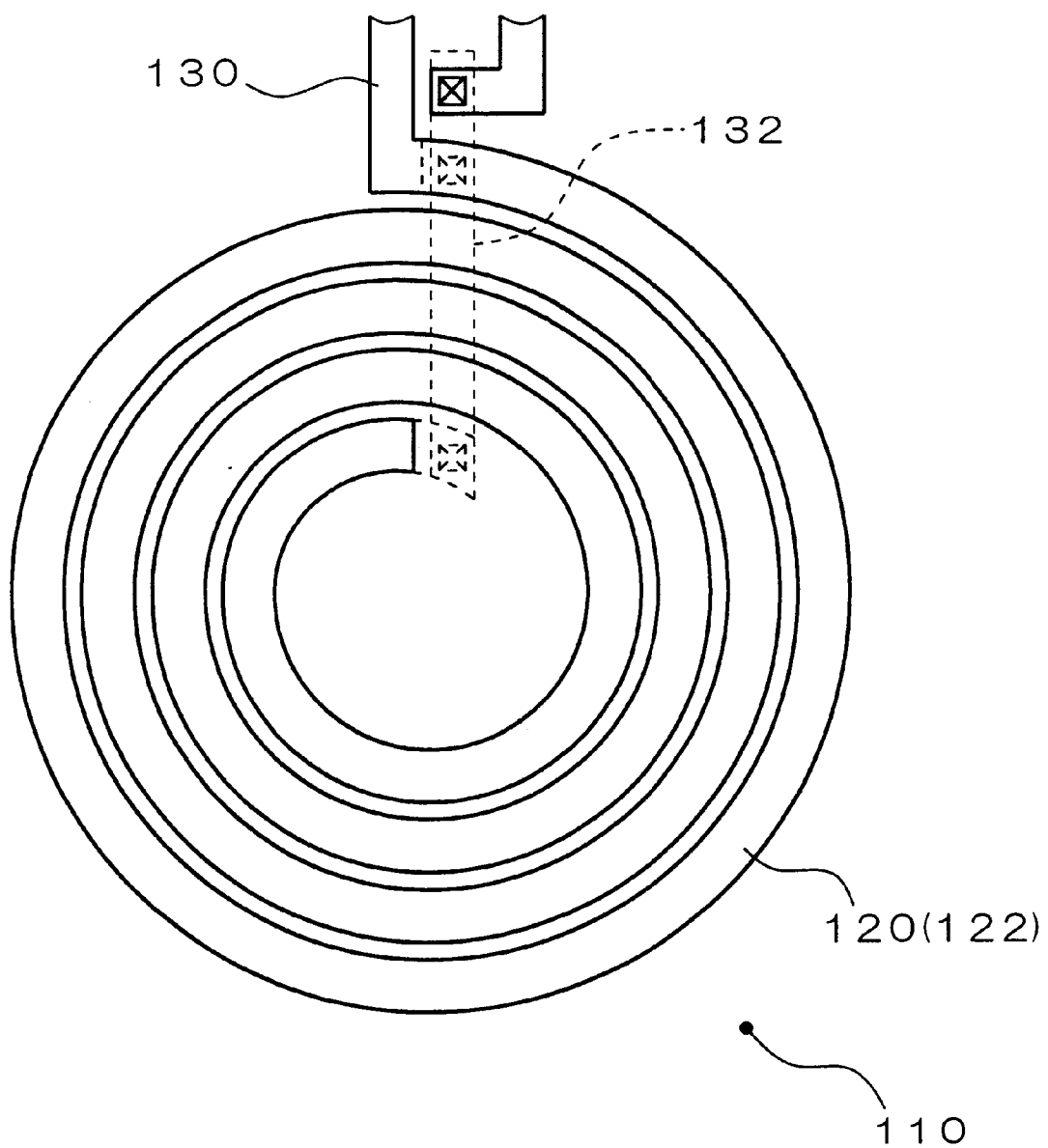
F I G. 18

LC OSCILLATOR

TECHNICAL FIELD

The present invention relates to an LC oscillator that can be formed on various kinds of substrates such as a semiconductor substrate.

BACKGROUND ART

There is known such a semiconductor circuit that forms a spiral pattern electrode on a semiconductor substrate by using thin film forming technique, and uses this pattern electrode as an inductor element. When current flows in such an inductor element that is formed on a semiconductor substrate, magnetic flux is generated in the direction perpendicular to a spiral pattern electrode. Nevertheless, since eddy currents are induced on the front side of the semiconductor substrate by this magnetic flux to cancel effective magnetic flux, there is such a problem that doesn't effectively function as the inductor element. In particular, since the higher a frequency of a signal which flows in the inductor element becomes, the more remarkable this inclination becomes, and consequently it is difficult to form an LC oscillator, including the inductor element as a resonance element, on a semiconductor substrate.

DISCLOSURE OF THE INVENTION

The present invention is achieved in view of such a point. Its object is to provide an LC oscillator that can perform oscillation even if the LC oscillator is formed on a substrate.

An inductor element included in an LC oscillator of the present invention has two conductors that are formed in piles on a substrate in the state where they are mutually insulated, and are connected with each other at both odd ends. While one conductor separating from the substrate is used as an inductor conductor, a lead wire of this inductor conductor is led out through a gap between another conductor, being near the substrate, and the substrate. It is experimentally confirmed that an inductor element that has such structure has predetermined inductance without losing an inductance component by eddy currents etc. even if the inductor element is formed on a substrate. With using this inductor element as a part of an LC oscillator, oscillation can be performed even if the LC oscillator is formed on the substrate. In particular, by leading out the lead wire of this inductor conductor included in the inductor element from between another conductor and the substrate, it becomes possible to preventing the flow of the effective magnetic flux, generated by the inductor conductor, to the minimum from being interrupted. Hence good characteristics can be obtained.

In case where the inductor element described above has three or more layers of metal layers formed on the substrate, it is desirable to form the two conductors described above and lead wires respectively with using different metal layers which are mutually apart by one or more layers. Since the inductor conductor can be made to be apart from the lead wires by at least two or more layers by adopting such constitution of the inductor element included in the LC oscillator, it is possible to further reduce the influence of the electric current that flows in the lead wires.

In addition, it is desirable to connect the two conductors included in the inductor element mentioned above at both odd ends with using a part of a lead wire of the inductor conductor extending from the one end of the inductor conductor. Since the number of the conducting wires (lead wires and connecting wires) that intersect the inductor conductor can be reduced, a degree of interrupting the flow of the effective magnetic flux generated by the inductor conductor can be further reduced. In addition, since the shape of a mask can be simplified when manufacturing each conductor and lead wires with using an aligner etc., it is possible to reduce a cost and labor hours for manufacturing the whole of the LC oscillator.

Furthermore, an inductor element included in the LC oscillator of the present invention has two conductors that are formed in piles on a substrate in the state where they are mutually insulated, and are connected with each other at both odd ends. While using one conductor apart from the substrate as an inductor conductor, one end of another conductor not connected to the inductor conductor is terminated with a predetermined impedance element. Although electric current flows also in another conductor by the effective magnetic flux generated by the inductor conductor in the inductor element, it becomes possible to prevent unnecessary reflection in this portion and to improve characteristics of the inductor element by terminating the end of the free side of another conductor with the impedance element. Hence, oscillation can be performed reliably by the LC oscillator comprising the inductor element. In addition, it is possible to adjust frequency characteristics or the like of another conductor by forming the impedance element described above with using any of a resistor, a capacitor, and an inductor or combining these. Hence it becomes possible also to adjust oscillation characteristics finely by adjusting a device constant of the impedance element at a suitable value.

In addition, it is desirable to adjust termination conditions by making it possible to change at least one device constant of a resistor, a capacitor, and an inductor, which constitute the impedance element described above, and making this device constant variable. By some external means, for example, by changing a value of a control voltage applied, it becomes possible to adjust a device constant of the whole impedance element, that is, characteristics of the inductor element by a change of termination conditions. It also becomes possible to adjust finely an oscillation frequency.

In particular, when the substrate described above is a semiconductor substrate, it is desirable to form the capacitor where a device constant can be changed by a variable capacitance diode. While it becomes possible to miniaturize parts by using the variable capacitance diode formed with using the semiconductor substrate, it becomes possible to reduce a cost for manufacturing LC oscillator by simplifying manufacturing process in comparison with the case where external parts are attached thereafter, and wiring etc. are performed. Similarly, when the substrate described above is a semiconductor substrate, it is desirable to form a variable resister made of an FET whose channel is used as a resistor. While it is possible to miniaturize parts by using the variable resistor made of the FET formed with using the semiconductor substrate, it becomes possible to reduce a cost for manufacturing LC oscillator by simplifying manufacturing process in comparison with the case where external parts are attached thereafter, and wiring etc. are performed.

In addition, it is desirable to form an inductor, which constitutes the impedance element, by a conductive layer formed on the substrate in predetermined shape. Since high Q is not required of the inductor used for terminating one end of a conductor, it is possible to realize the inductor with a conductor pattern on the substrate. Moreover, since it becomes possible to form this conductor pattern at the same process with using a metal layer for performing various kinds of wiring etc., it becomes possible to perform miniaturization of entire LC oscillator, simplification of process, and cost reduction.

In addition, as a substrate mentioned above, it is preferable to use a semiconductor substrate, and to form each configuration parts of LC oscillator on the substrate. If the inductor element that effectively functions can be formed on a semiconductor substrate, it is possible to form each configuration parts for LC oscillator, including the inductor element, on the semiconductor substrate. Hence it becomes possible to form the whole of the LC oscillator on the semiconductor substrate without using any external parts.

In addition, it is desirable to form two conductors, described above, in the substantially same shape or long shape. Since an upper conductor never directly faces the front side of the substrate owing to making the two conductors the same in shapes, it is possible to reduce the eddy currents that are generated on the substrate when the upper conductor directly faces the substrate. In addition, it is possible to give predetermined inductance to the upper conductor by making the shapes of the two conductors be long. In particular, since it is possible to give large inductance to a conductor when the conductor is formed in one or more turns of spiral shape or a meander shape, the conductor is suitable for being built in an LC oscillator having comparatively low frequency. In addition, since it is possible to give a small inductance to a conductor when the conductor is formed in a circular shape less than one turn or an substantially linear shape in comparison with the case where the conductor is formed in a spiral shape or the like, the conductor is suitable for being built in an LC oscillator having comparatively high frequency.

Moreover, when two conductors are made in spiral shapes, it is preferable to connect an inner end of one conductor with an outer end of another conductor. Since it is experimentally confirmed that it is possible to secure further large inductance when an inductor conductor is formed on a substrate owing to performing such connection, it is possible to realize the inductor element that effectively functions on a substrate. In particular, when the shape is a spiral one having one or more turns, it is necessary to extend a lead wire from the inner circumferential end of the inductor conductor having this spiral shape. Nevertheless, it is possible to suppress to the minimum the interruption of flow of the effective magnetic flux, generated by the inductor conductor, by leading out the lead wire between the conductor, being near the substrate, and the substrate.

In addition, the inductor element described above is suitable for use as a compound element that also has a capacitance component besides an inductance component. Since this inductor element has two conductors, mutually superimposed, and a capacitance component is also included in its characteristics, the characteristics of this inductor element can be effectively used by using this inductor element as one part of the LC oscillator where an inductor and a capacitor are used in combination.

BRIEF DESCRIPTION OF THE DRAWINGS

FIG. 11 is a schematic diagram showing a structure of an inductor element according to a second embodiment;

FIG. 18 is a drawing showing a modified example of the inductor element, the drawing where a connecting wire that connects ends of two conductors is omitted.

BEST MODE FOR CARRYING OUT THE INVENTION

Hereafter, an LC oscillator according to an embodiment where the present invention is applied will be specifically described with referring to drawings.

First Embodiment

Figure 1:
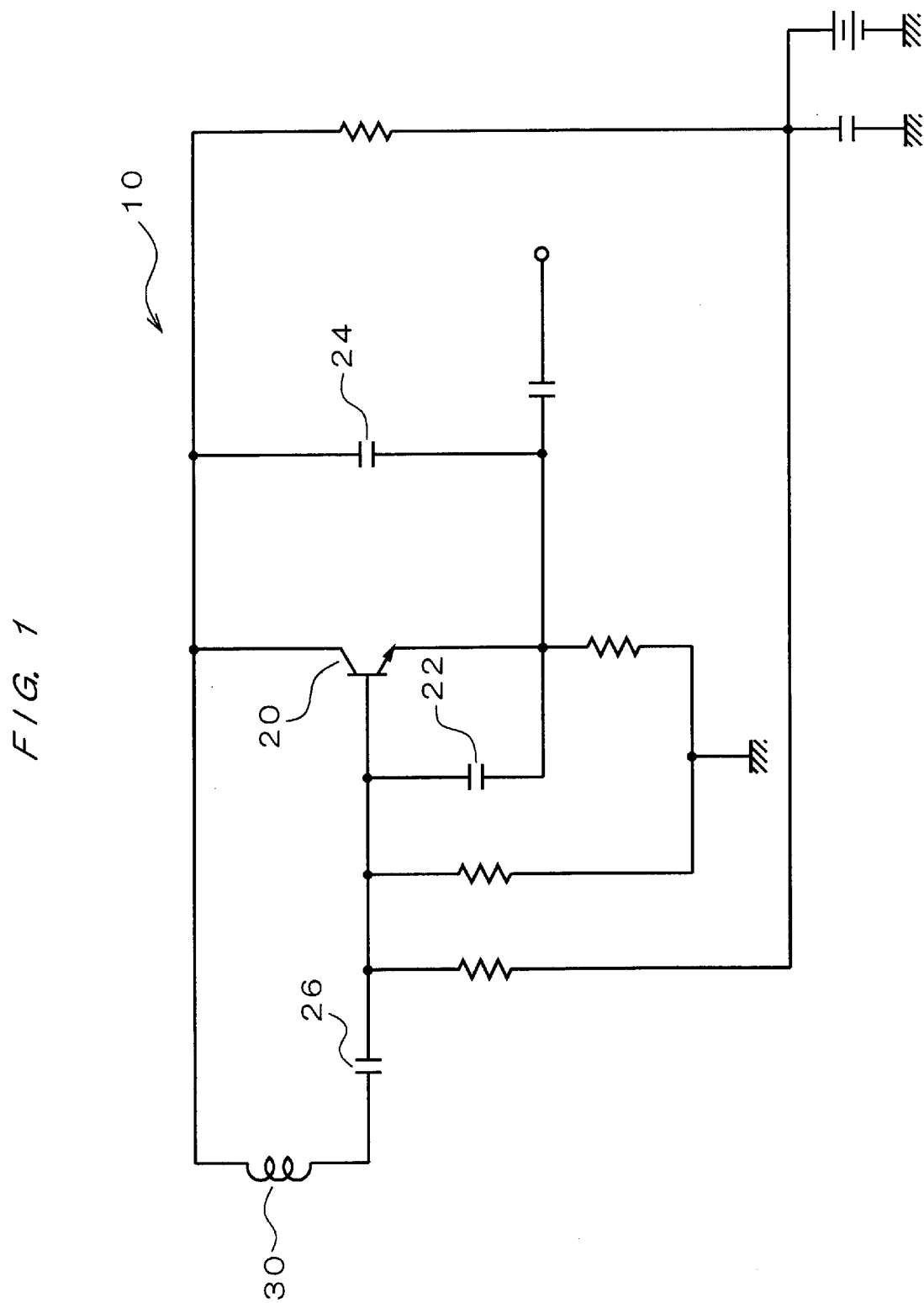
FIG. 1 is a circuit diagram showing a configuration of an LC oscillator according to a first embodiment.

FIG. 1 is a circuit diagram showing a configuration of an LC oscillator according to the first embodiment. An LC oscillator 10 shown in FIG. 1 has a transistor 20, a capacitor 22 connected between the base and the emitter of the transistor 20, a capacitor 24 connected between the emitter and the collector of the transistor 20, a capacitor 26 connected serially between the base and the collector of the transistor 20 and an inductor element 30.

In this LC oscillator 10, the capacitance of two capacitors 22 and 24 maybe several tens times the between-terminal capacity of a transistor 20. In addition, an inductor element 30 is connected through a capacitor 26.

An LC oscillator 10 having the configuration described above in this embodiment is a Clapp circuit that is an advanced Colpitts circuit. In the LC oscillator 10, a capacitor of a resonant circuit that determines an oscillation frequency becomes equivalent to series connection of capacitors 22, 24, and 26. Hence, it is possible to select larger capacitance of capacitors 22 and 24 than that of the Colpitts circuit that does not have a capacitor equivalent to the capacitor 26. Therefore, even if the capacitance between terminals of a transistor 20 changes, it does not give large influence to the resonant frequency of a resonant circuit, and hence it is possible to improve the stability of the oscillation frequency.

Figure 2:
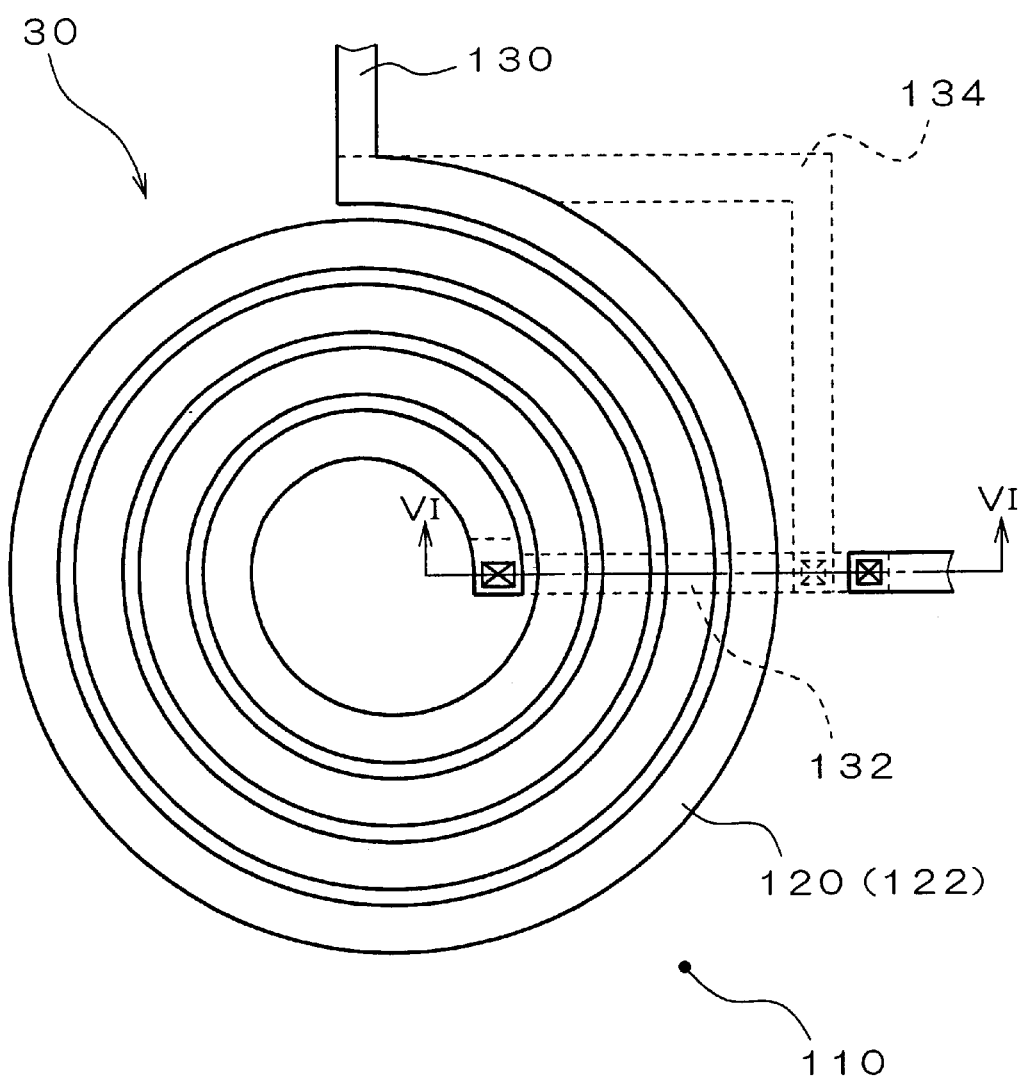
FIG. 2 is a schematic diagram showing a planar structure of an inductor element included in the LC oscillator shown in FIG. 1.
Figure 3:
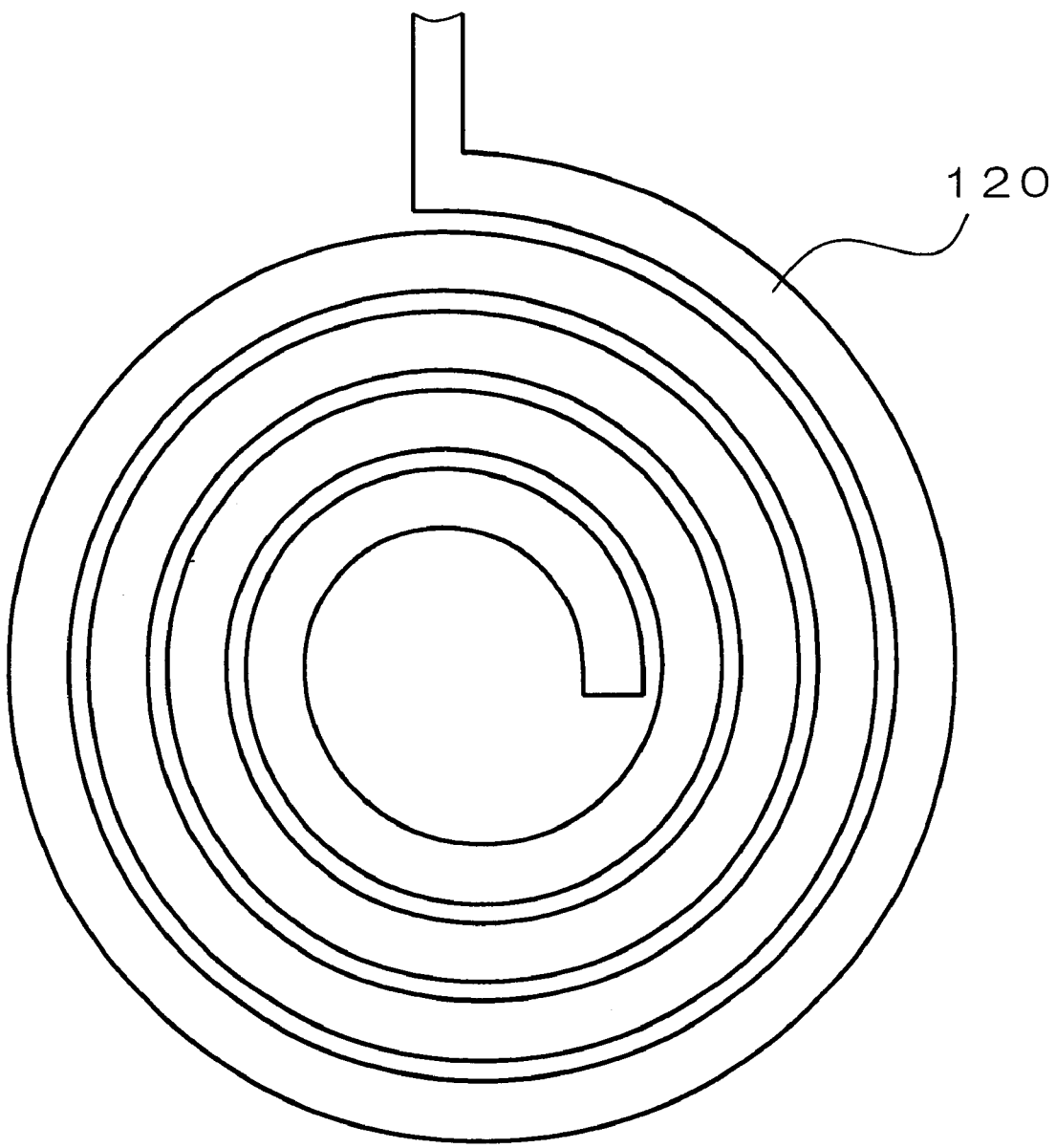
FIG. 3 is a drawing showing an upper layer of conductor included in the inductor element shown in FIG. 2.
Figure 4:
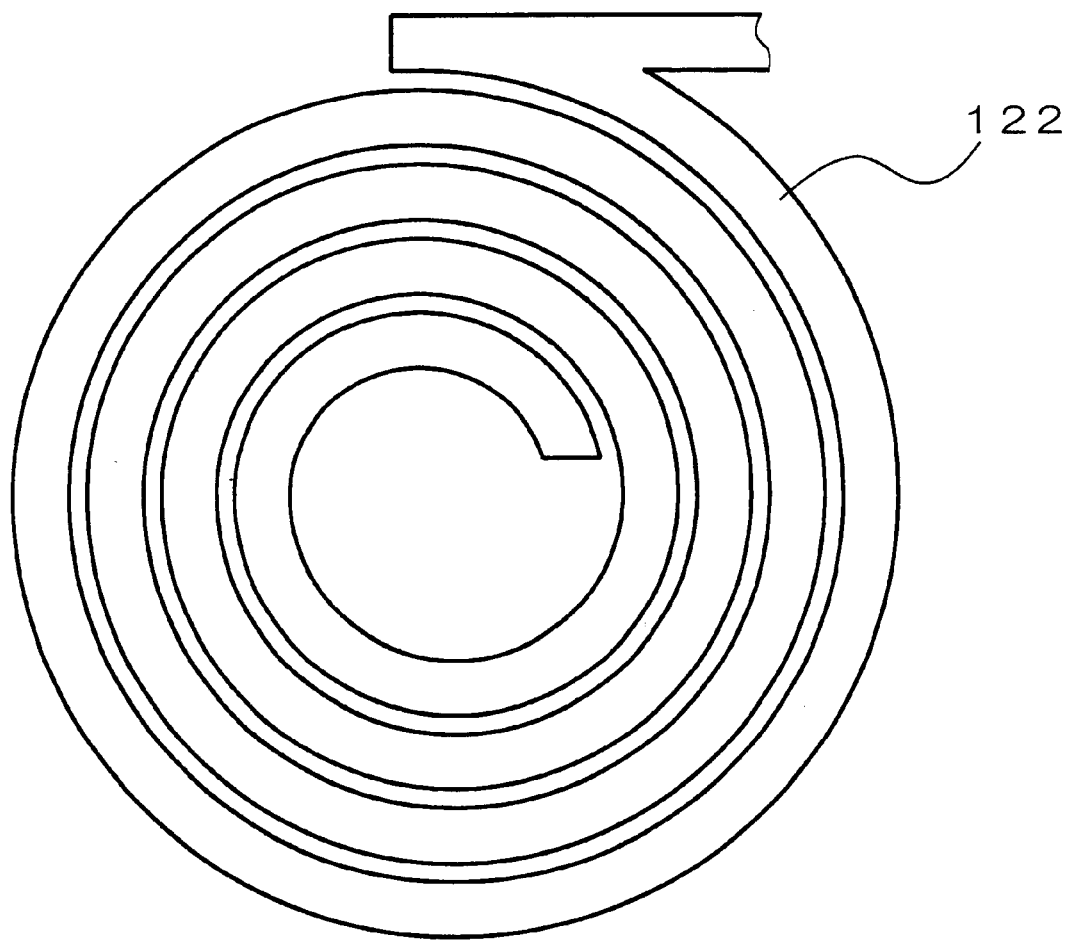
FIG. 4 is a drawing showing a shape of a lower layer of conductor included in the inductor element shown in FIG. 2.

FIG. 2 is a schematic diagram showing a planar structure of an inductor element 30 included in the LC oscillator 10 according to this embodiment. In addition, FIG. 3 is a drawing showing an upper layer of conductor included in the inductor element 30 shown in FIG. 2. FIG. 4 is a drawing showing a shape of a lower layer of conductor included in the inductor element 30 shown in FIG. 2.

An inductor element 30 according to this embodiment has two conductors 120 and 122 that have spiral shapes and are formed on the surface of a semiconductor substrate 110. These two conductors 120 and 122 have substantially the same shape. When viewed from the front side of the semiconductor substrate 110, they are formed so that the conductor 120, which becomes an upper layer, and another conductor 122, which becomes a lower layer, are formed by being superimposed one on the other substantially exactly. Each of the conductors 120 and 122 is formed of, for examples, a thin film of metal (metal layer), or semiconductor material such as poly silicon.

Figure 5:
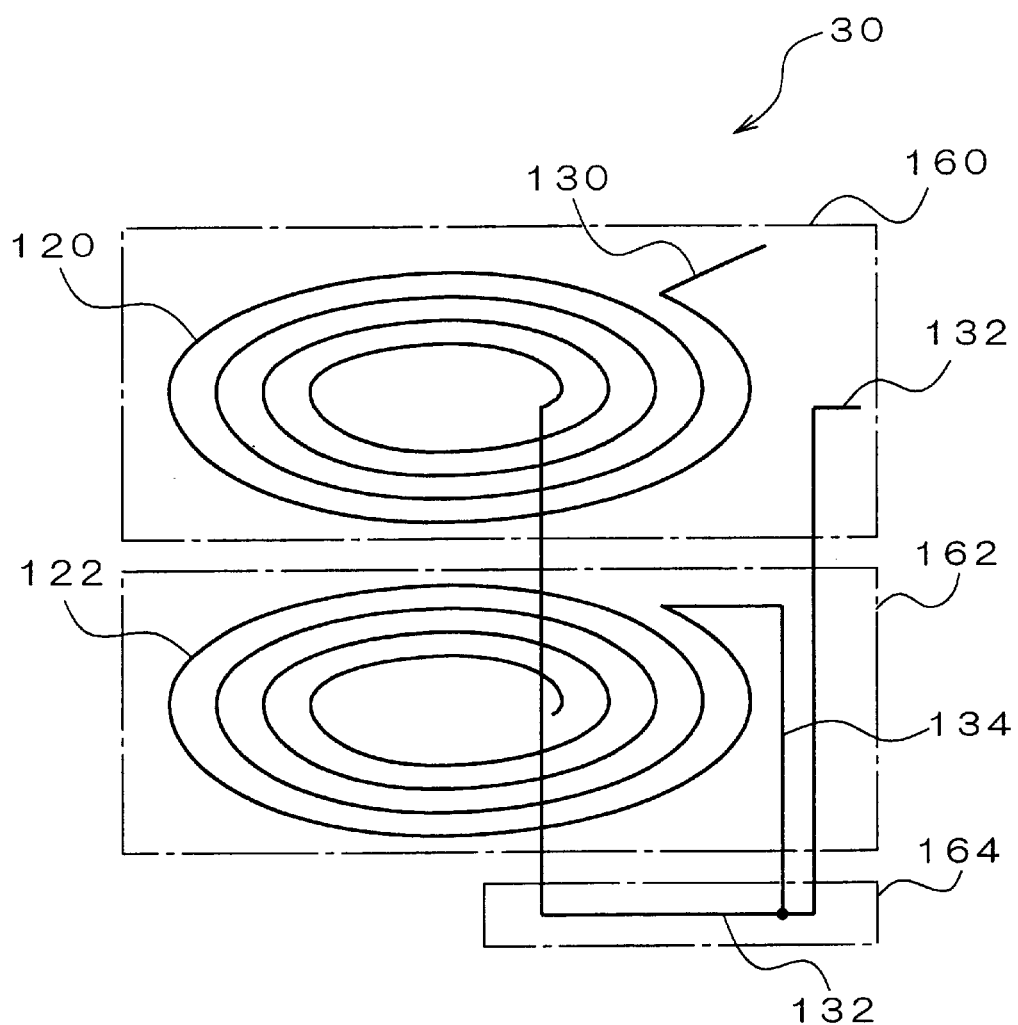
FIG. 5 is a schematic diagram showing a connection state of two conductors included in an inductor conductor.

FIG. 5 is a schematic diagram showing a connection state of the two conductors 120 and 122, described above. As shown in FIG. 5, lead wires 130 and 132 are connected to an outer end (outer circumferential end) and an inner end (inner circumferential end) of the upper conductor 120 respectively, and the inner end of the upper conductor 120 and the outer end of the lower conductor 122 are connected with a connecting wire 134.

The upper conductor 120 functions as an inductor conductor, and is connected to other configuration parts formed on the semiconductor substrate 110 through the lead wires 130 and 132 connected to ends thereof.

Figure 6:
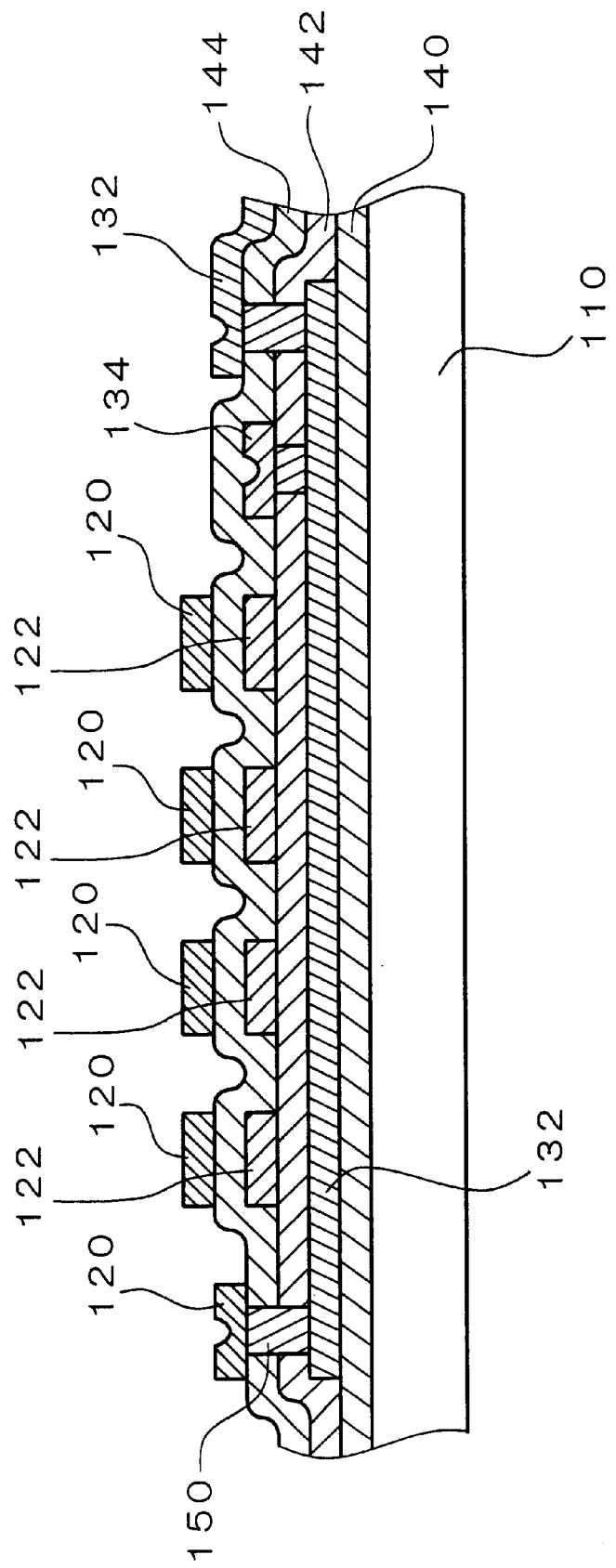
FIG. 6 is an enlarged sectional view taken on line VI—VI in FIG. 2.

FIG. 6 is an enlarged sectional view taken on line VI—VI in FIG. 2. As shown in FIGS. 5 and 6, at least three layers of metal layers 160, 162, and 164 are formed on the surface of the semiconductor substrate 110. One conductor 120 as an inductor conductor is formed with using a top layer of metal layer 160 that is most apart from the semiconductor substrate 110, and another conductor 122 is formed with using a middle layer of metal layer 162.

In addition, the lead wire 132 led out from the inner circumferential end of the top layer of conductor 120 is formed with using a bottom layer of metal layer 164 nearest to the semiconductor substrate 110. For example, as shown in FIG. 6, the inner circumferential end of the conductor 120 and one end of the lead wire 132 are connected through a through hole 150. The lead wire 132 formed from the bottom layer of metal layer 164 is led out outward so that the lead wire 132 may be orthogonal to each circumferential portion of the inductor conductor with a spiral shape. In addition, insulating layers 140, 142, and 144 are formed between the conductors 120 and 122, and the lead wire 132, which are formed with using three metal layers 160, 162, and 164, and the semiconductor substrate 110 respectively, and mutual insulation is performed.

An inductor element 30 in this embodiment has the structure described above. Since predetermined inductance appears between the lead wires 130 and 132 connected to both ends of the upper layer of conductor 120 respectively, this upper conductor 120 can be used as an inductor conductor. In addition, under this upper conductor 120, the conductor 122 that has substantially the same shape as this conductor 120 is formed. It is possible to suppress the generation of eddy currents in the front side of the semiconductor substrate 110 when an upper conductor 120 is used as an inductor conductor, by connecting one end of the upper conductor 120 with one end of the lower conductor 122 with the connecting wire 134. Hence it is possible to make the upper conductor 120 effectively function as an inductor conductor.

Furthermore, in the inductor element 30 in this embodiment, the lead wire 132 led out from the inner circumferential end of the upper layer of conductor 120 serving as an inductor conductor is formed with using the bottom layer of metal layer 164, and is located with being most apart from the inductor conductor through the other conductor 122. Hence it is possible to suppress to the minimum interruption of flow of the effective magnetic flux generated by the inductor conductor, and to obtain good characteristics. In this manner, the inductor element 30 included in the LC oscillator 10 in this embodiment can be formed with using at least three layers of metal layers 160, 162, and 164 on the surface of the semiconductor substrate 110. Hence it becomes possible to realize forming the inductor element 30 with other parts in one piece to perform integration on the semiconductor substrate 110.

By the way, the present applicant performed various kinds of experiments about the effectiveness of LC oscillator that an inductor element formed by locating the two conductors 120 and 122 is applied, described above, in piles on a substrate and mutually connecting both odd ends. Then, the present applicant has already applied for a patent on the basis of the experimental result (Japanese Patent Application No. H10-140541). The LC oscillator 10 in this embodiment is an advanced one, and is intended to improve characteristics of inductor element 30 used for the LC oscillator 10 by devising a leading-out position of the lead wire 132 with using that the two conductors 120 and 122 have two layer structure. For example, supposing that an inductor conductor with a spiral shape is simply formed on a semiconductor substrate or another substrate, even if a lead wire is formed with using an upper layer or a lower layer of metal layer which is adjacent to a metal layer in which this inductor conductor is formed, it is the same that the inductor layer and the lead wire are closely located. Hence the lead wire interrupts the effective magnetic flux generated by the inductor conductor. However, in the inductor element 30 included in the LC oscillator 10 in this embodiment, another conductor 122 is located between one conductor 120, serving as an inductor conductor, and the lead wire 132. Hence it is possible to reduce the turbulence of the effective magnetic flux at the time of leading out the lead wire 132 so that the lead wire 132 may intersect the inductor conductor 120.

Hereafter, the effectiveness of the LC oscillator in this embodiment will be described with reference to the experimental result shown in the application described above (Japanese Patent Application No. H10-140541).

Figure 7:
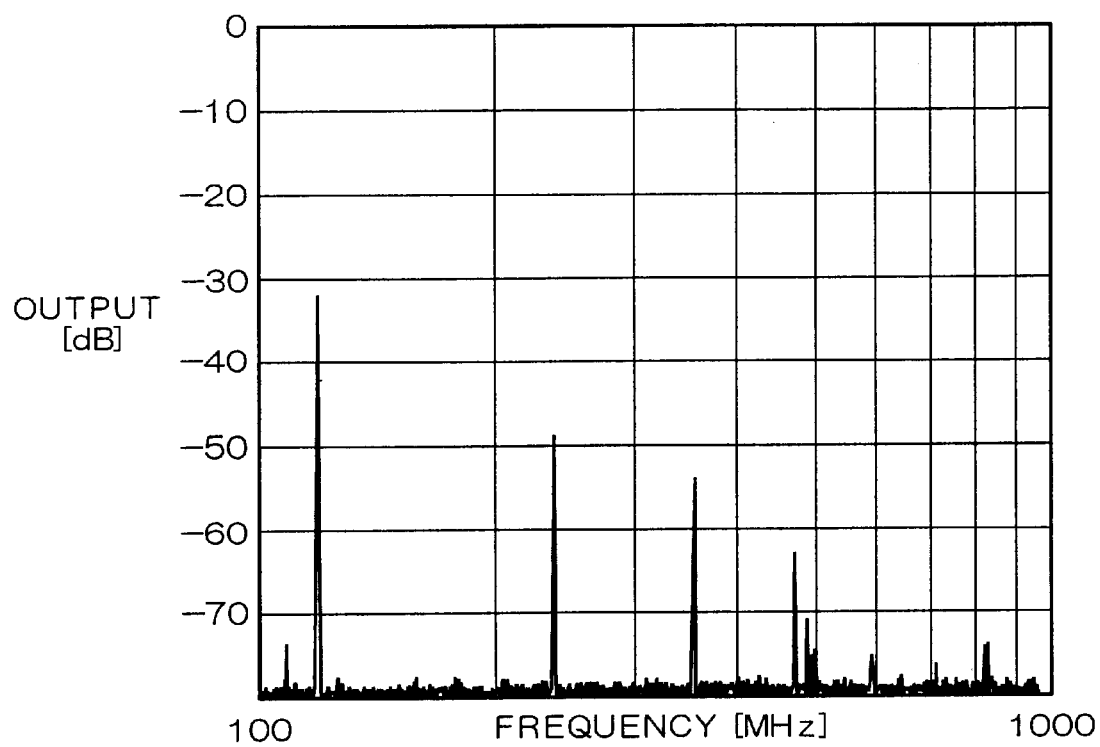
FIG. 7 is a chart showing measurement result of an output characteristic of an LC oscillator.

FIG. 7 is a graph showing the measurement result of the output characteristics of an LC oscillator configured with an inductor element which has an electrode of one layer having the same shape as the conductor 120 included in the inductor element 30. As for the inductor element used in this measurement of the output characteristics, a five-turn electrode having one-mm pattern width and a 0.2-mm adjacent gap of spiral pattern was formed on a front side of a 0.13-mm-thick insulating member with a dielectric constant of 3.17. In addition, vertical axes in FIG. 7 (this is the same also in FIGS. 9 and 10 which are described later) denote output amplitudes logarithmically expressed, and horizontal axes denote the frequencies of output signals logarithmically expressed, respectively. As shown in FIG. 7, an oscillation frequency of 119 MHz was observed when the LC oscillator performs in the state with sufficiently separating the inductor element including such an electrode of one layer from other conductor substrate or semiconductor substrate.

Figure 8:
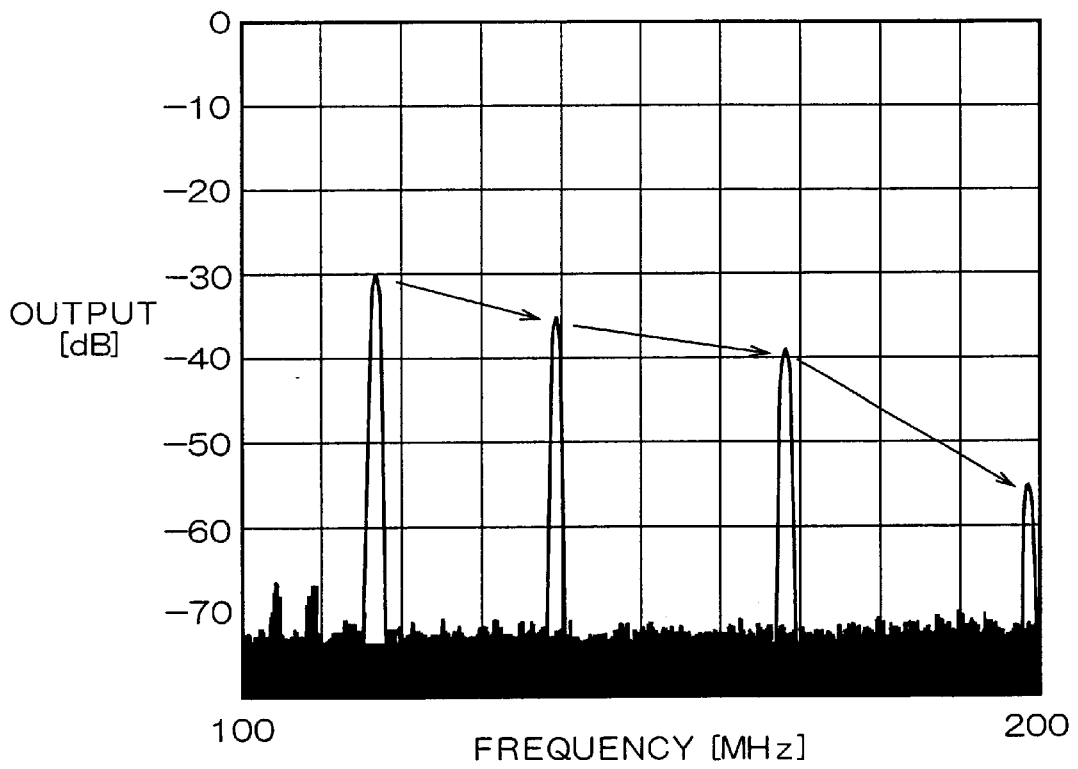
FIG. 8 is a chart showing measurement result of an output characteristic of an LC oscillator.

FIG. 8 is a graph showing the output characteristic of an LC oscillator at the time of gradually bringing a copper plate, which is a conductive substrate, close to the inductor element used for the measurement of the output characteristics shown in FIG. 7. Vertical axes in FIG. 8 denote output amplitudes logarithmically expressed, and horizontal axes denote the frequencies of output signals, respectively. As shown in FIG. 8, it was observed that, when the copper plate was gradually brought close to this inductor element in the state of oscillation with using the inductor element comprising one layer of electrode, the oscillation frequency became higher from 118 MHz to 139 MHz, 168 MHz, or 198 MHz. Furthermore, it was observed that oscillation stopped when the copper plate was closely contacted to the electrode with sandwiching an insulating member having the thickness of 3.17 mm.

Thus, if an inductor element simply made of one layer of electrode in a spiral shape is adopted and is formed on a copper plate, oscillating operation of an LC oscillator stops. This is because the inductance that the inductor element comprising one layer of electrode has becomes small by making the copper plate approach the inductor element. The reason why the inductance becomes small when the copper plate is made to approach the inductor element maybe that eddy currents arise on a surface of the copper plate owing to the magnetic flux generated when a signal is inputted into an electrode to cancel this magnetic flux.

Figure 9:
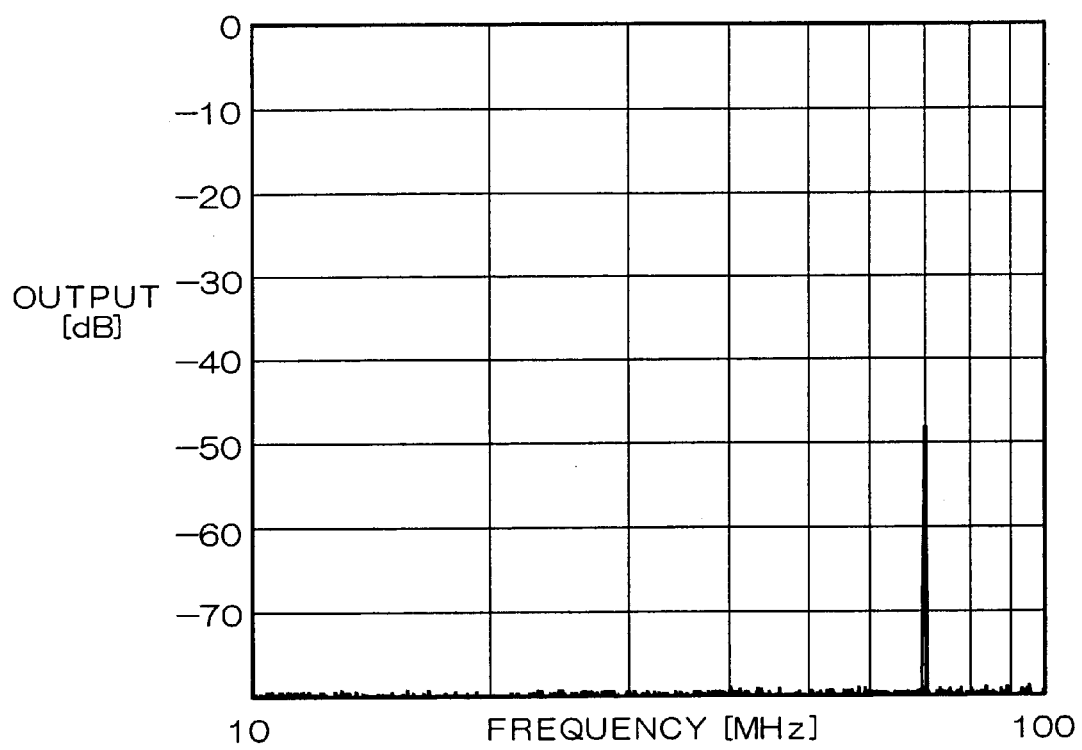
FIG. 9 is a chart showing measurement result of an output characteristic of an LC oscillator.
Figure 10:
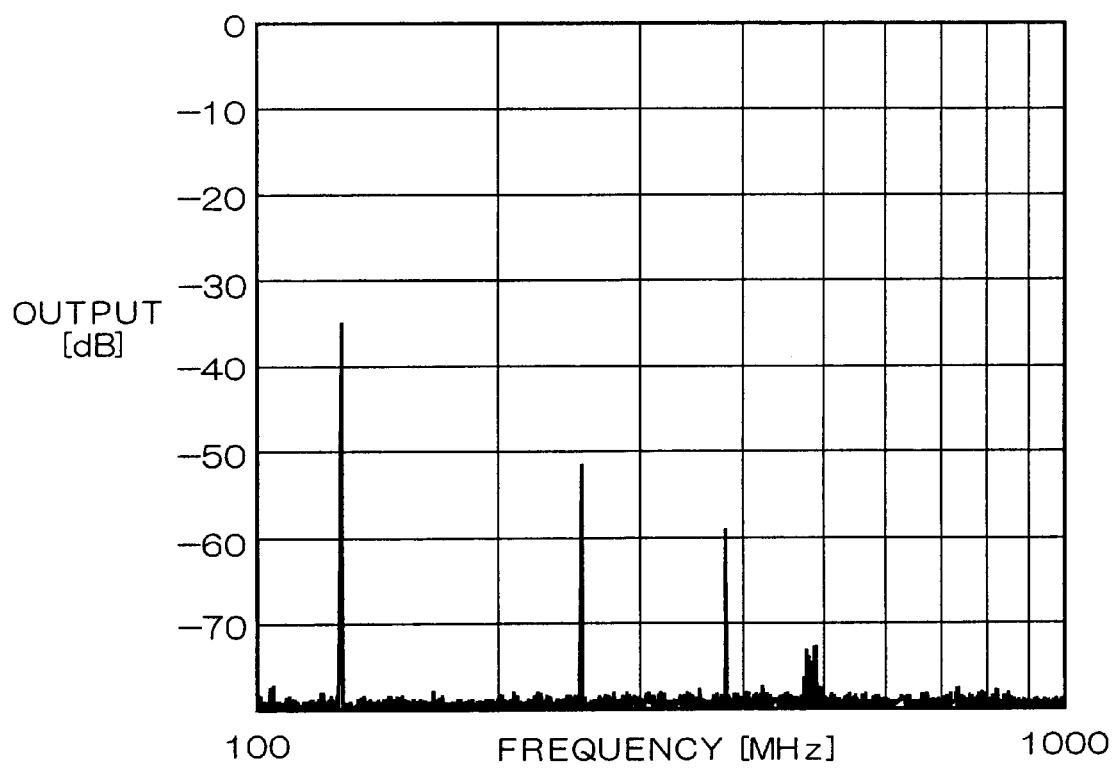
FIG. 10 is a chart showing measurement result of an output characteristic of an LC oscillator.

FIG. 9 is a graph showing the measurement result of the output characteristic in the case of configuring an LC oscillator with using two layers of electrodes that have the same shape and arrangement as two conductors 120 and 122 included in the inductor element 30 shown in FIG. 2. In addition, FIG. 10 is a graph showing the output characteristic of an LC oscillator in the case of closely contacting a copper plate to an inductor element having the same shape and arrangement as two conductors 120 and 122 included in the inductor element 30.

The inductor element used for these measurements has the structure that an electrode corresponding to the conductor 122 shown in FIG. 2 is added to the inductor element shown in the measurement result in FIGS. 7 and 8. In addition, if closely contacting the copper plate to this inductor element, the lower electrode and copper plate are arranged through an adequate thin insulating member.

In the state of sufficiently separating an inductor element from other conductive members, an LC oscillator using the inductor element where two layers of spiral electrodes are located with facing each other has an oscillation frequency near 70 MHz as seen from the measurement result shown in FIG. 9. The reason why this oscillation frequency becomes lower than the oscillation frequency (119 MHz) at the time of using the inductor element comprising one layer of electrode shown in FIG. 7 is that, since the inductor element comprising two layers of electrodes function as a compound element which has an inductance component and a capacitance component, this capacitance component lowers a resonant frequency of the resonant circuit including the inductor element.

In addition, in a state of closely contacting the inductor element having the electrode of two layers mentioned above to the copper plate, as shown in FIG. 10, a similar result appears although the position of a oscillation frequency (127 MHz) shifts. This shows that, by using the inductor element that has the double structure of the electrodes described above, even if the inductor element is closely contacting to the copper plate, the inductance component does not disappear and the function as an inductor conductor is maintained.

Thus, the inductor element made by forming two layers of electrodes in a spiral shape functions as an inductor conductor without the inductance component disappearing even if a copper plate is closely contacted to one side (the electrode opposite to the electrode used as an inductor conductor) of them, and the oscillating operation of the LC oscillator where this is used is maintained. Hence even if this inductor element 30 and each configuration part of the LC oscillator 10 other than the inductor element 30 is formed on the semiconductor substrate 110, it is possible to make the LC oscillator 10 perform oscillating operation by using the inductor element 30 in this embodiment which has the fundamentally same structure.

Second Embodiment

FIG. 11 is a diagram showing the structure of an inductor element 30A applied for an LC oscillation in a second embodiment. The whole structure of the LC oscillator in this embodiment is basically same as the LC oscillator of the first embodiment shown in FIG. 1, and its detailed explanation is omitted. The inductor element 30A included in the LC oscillator according to this embodiment is different in that a predetermined impedance element 200 is added to the inductor element 30 in the first embodiment shown in FIG. 5. Namely, in the inductor element 30 in the first embodiment described above, with paying attention to the other conductor 122 located so as to substantially superimpose the one conductor 120 serving as an inductor conductor, only one end (the outer circumferential end in the example shown in FIG. 2) is connected to the connecting wire 134 and the inner circumferential end is free (open state). In this embodiment, the characteristics of the whole inductor element 30A can be improved or adjusted by terminating the inner circumferential end of the conductor 122 through the impedance element 200.

For example, when electric current flows into the one conductor 120 of the inductor element 30A, induced current flows to or electric current directly flows through the connecting wire 134 into the other conductor 122. However, it becomes possible to prevent unnecessary reflection in this inner circumferential end by terminating the inner circumferential end of the other conductor 122 through the impedance element 200. In addition, it becomes easy to improve or change the frequency characteristic of a circuit including the inductor element 30A by adjusting or changing a device constant of the impedance element 200. For example, what is necessary to make a frequency low is just to use an inductor as the impedance element 200. On the contrary, what is necessary to make a frequency high is just to use a capacitor as the impedance element 200. Alternatively, the impedance element 200 can be formed with arbitrarily combining these, that is, an inductor, a capacitor, and a resistor.

In addition, a chip part of an inductor, a capacitor, or a resistor can be most easily used for the impedance element 200 described above. In addition, in consideration of forming two conductors 120 and 122, and the like, which constitute the inductor element 30A, on the semiconductor substrate 110 as shown by the cross-sectional structure in FIG. 6, it is desirable also to form the impedance element 200 on the semiconductor substrate 110 with using semiconductor manufacturing technology. For example, what is conceivable is to form a resistor with using a highly resistive material, to form a capacitor with making two layers of metal layers, having predetermined areas, face each other, or to form an inductor with using conductors having predetermined shapes. In addition, since the impedance element 200 is used as an element for termination, not-so-high Q is required even if this is realized with an inductor. For this reason, it also becomes possible to use an inductor constituted by forming a conductor with a predetermined shape (for example, a spiral shape) on the semiconductor substrate 110 as the impedance element 200.

Figure 12:
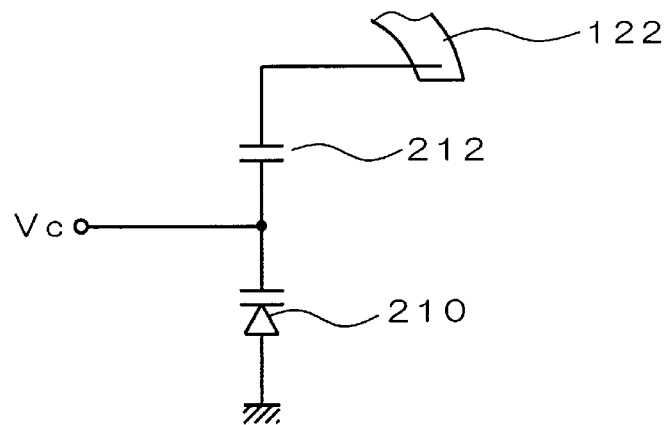
FIG. 12 is a drawing showing the structure in the case of connecting a variable capacitance diode to the inner circumferential end of a lower layer of conductor.

In addition, it is also good to use the impedance element 200 whose device constant can be changed by external control means. FIG. 12 is a diagram showing the structure in the case of connecting a variable capacitance diode 210 to the inner circumferential end of the conductor 122. The variable capacitance diode 210 operates as a capacitor with predetermined capacitance by using it in a reverse biased state, whose capacitance is changed by changing a reverse bias voltage. This variable capacitance diode 210 is connected to the inner circumferential end of the conductor 122 through a capacitor 212 for DC component removal.

Figure 13:
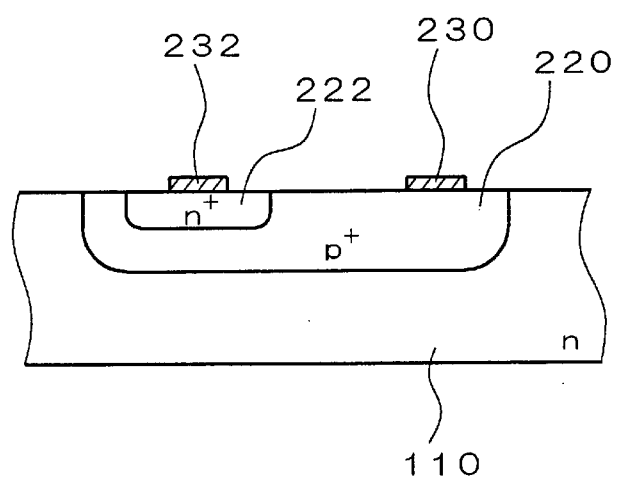
FIG. 13 is a drawing showing the cross-sectional structure in the case of forming the variable capacitance diode, shown in FIG. 12, on a semiconductor substrate.

FIG. 13 is a drawing showing the cross-sectional structure in the case of forming the variable capacitance diode 210, shown in FIG. 12, on the semiconductor substrate 110. As shown in FIG. 13, a p+ region 220 formed near the surface of the semiconductor substrate 110 formed of an n type silicon substrate (n-Si substrate) and an n+ region 222 further formed in a part thereof are included, and these p+ regions 220 and n+ region 222 form a pn junction layer. In addition, an electrode 230 for grounding is formed on the surface of the p+ region 220, and an electrode 232 for applying an variable reverse bias voltage as a control voltage Vc is formed on the surface of the n+ region 222. By applying the positive control voltage Vc to the electrode 232, the variable capacitance diode 210 whose capacitance changes according to the amplitude of this control voltage Vc can be formed.

Figure 14:
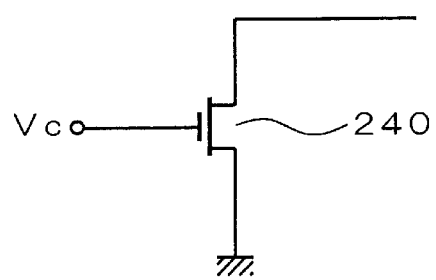
FIG. 14 is a diagram showing the structure in the case of connecting a variable resistor to the inner circumferential end of a lower layer of conductor.

FIG. 14 is a diagram showing the structure in the case of connecting a variable resistor, formed of an FET 240, to the inner circumferential end of the conductor 122. As shown in FIG. 14, the variable resistance is easily realizable by using a channel of the FET 240 as a resistor. By changing the control voltage Vc applied to a gate electrode, the resistance of the channel formed between a source and a drain can be changed. In addition, the FET 240 can be easily formed on the semiconductor substrate 110 by forming a source region and a drain region near the surface of the semiconductor substrate 110, and forming electrodes with predetermined shapes near regions in which the source and the drain and channels therebetween are formed.

Thus, it is possible to change termination conditions by terminating one end of the conductor 122 with using an impedance element whose device constant can be changed according to the control voltage Vc applied from the external. Hence, even if a frequency of a signal inputted into or outputted from the inductor element 30A is changed, it is possible to adjust the termination conditions according to the change, and hence, to improve characteristics of the LC oscillator.

The present invention is not limited to the above-described embodiments, but various types of modifications are possible within the scope of the gist of the present invention. For example, in the inductor element 30 shown in FIG. 2, the inner end of the upper conductor 120 and the outer end of the lower conductor 122 are connected through the connecting wire 134. Nevertheless, on the contrary, it can be also performed to mutually connect the outer end of the upper conductor 120 and the inner end of the lower conductor 122. In addition, it can be also performed to connect either outer ends or both inner ends of conductors 120 and 122 when it is allowed that the inductance of an inductor element becomes small to some extent.

Figure 15:
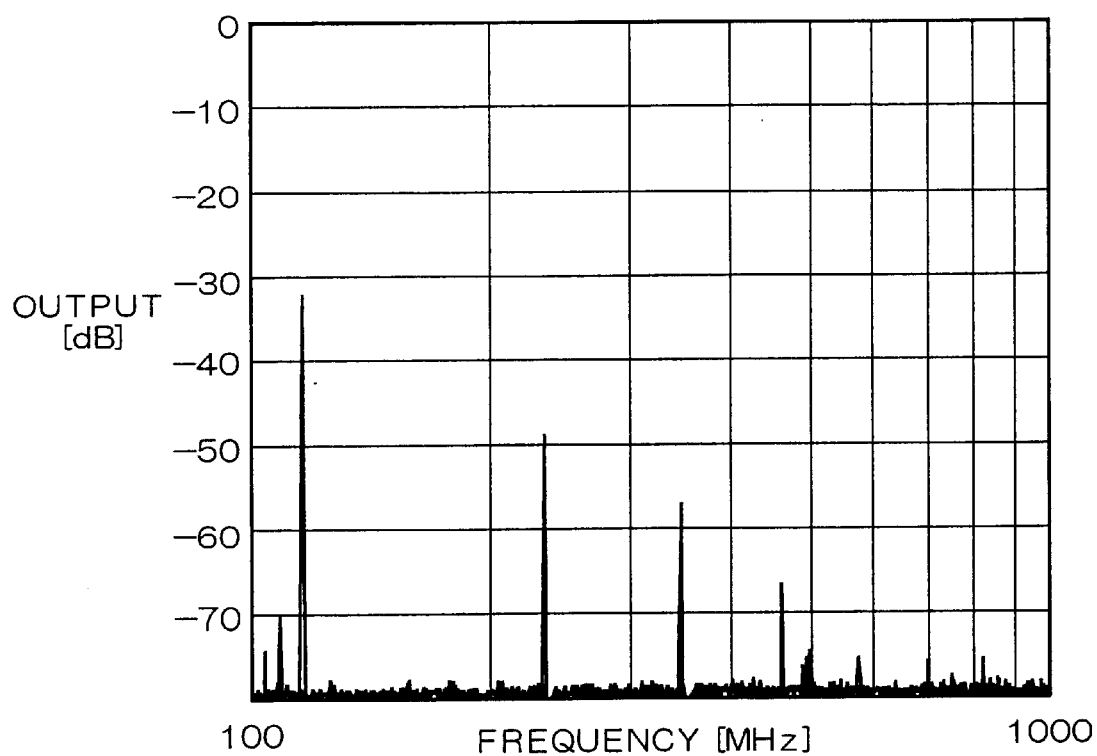
FIG. 15 is a chart showing measurement result of an output characteristic of an LC oscillator.
Figure 16:
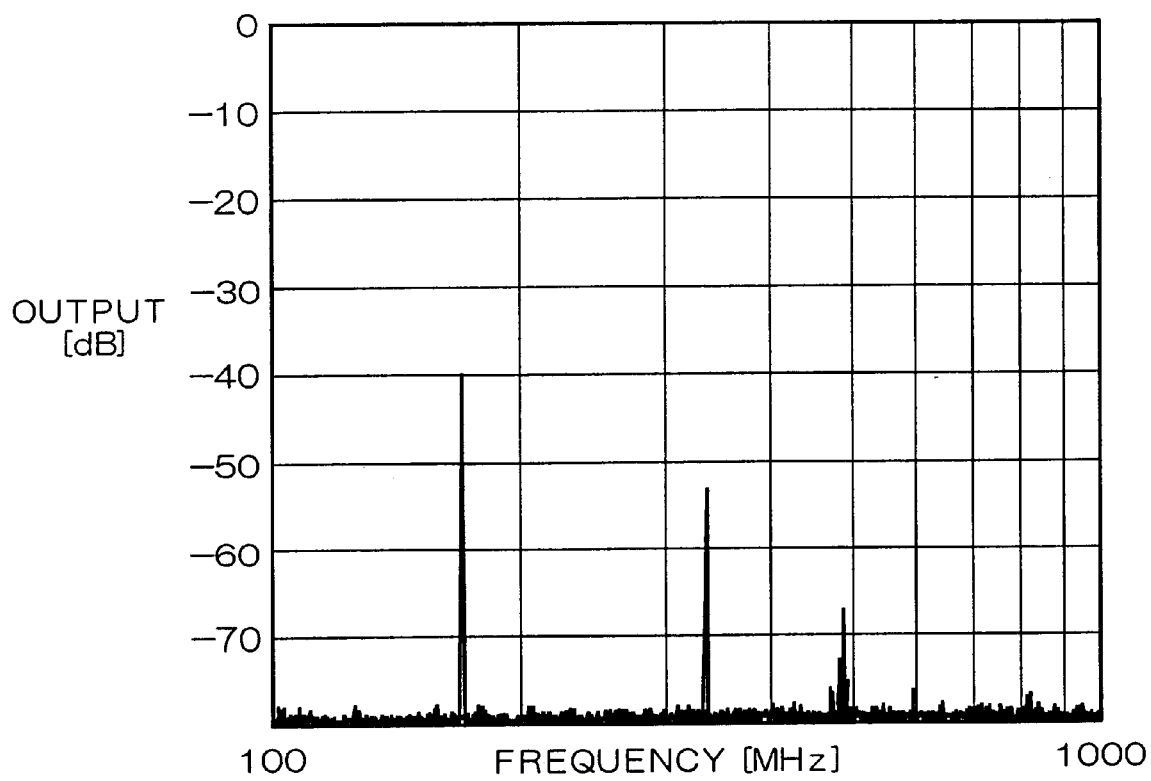
FIG. 16 is a chart showing measurement result of an output characteristic of an LC oscillator.

FIG. 15 is a graph showing the measurement result of the output characteristic in the case of configuring an LC oscillator with using an inductor element that has two layers of electrodes in the same shape and arrangement as two conductors 120 and 122 included in the inductor element 30 shown in FIG. 2 and in which each outer circumferential end of the two electrodes is mutually connected. In addition, FIG. 16 is a graph showing the measurement result of the output characteristic of the LC oscillator at the time of closely contacting the copper plate to the inductor element used for the characteristic measurement shown in FIG. 15. In addition, these measurement results come from the experimental results included in the application described above (Japanese Patent Application No. H10-140541) as it is. As shown in these figures, in the LC oscillator where the inductor element in which both outer circumferential ends of two electrodes are mutually connected is used, its oscillation frequency changes from 117 MHz to 171 MHz by closely contacting the copper plate. Nevertheless, oscillating operation is maintained without stopping.

In addition, since two conductors 120 and 122 included in the inductor elements 30, 30A are formed in spiral shapes in the embodiments described above, it is possible to realize the inductor elements 30, 30A having large inductance.

Figure 17:
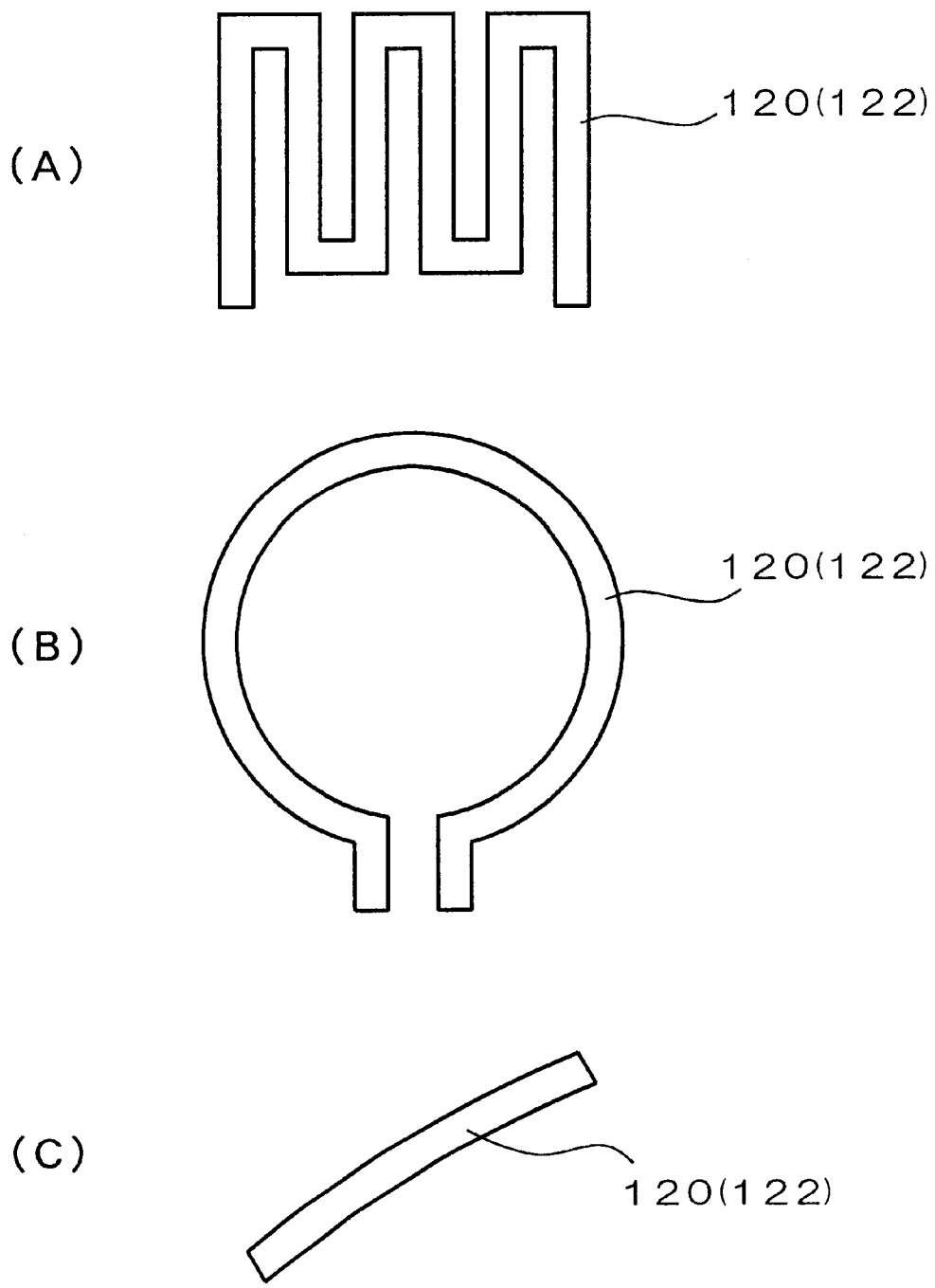
FIGS. 17A through 17C are schematic diagrams showing modified examples of the conductors included in the inductor elements.

Nevertheless, it is also good to form two conductors 120 and 122 in meander shapes (FIG. 17A) In addition, the inductance of the inductor elements 30, 30A can be small when they are used as one part of a high frequency circuit. Hence it is also good to form the inductor elements 30, 30A less than one turn by reducing the numbers of turns of the conductors 120 and 122 (FIG. 17B), or to form them in an substantially linear shape (FIG. 17C).

In addition, although the shapes of two conductors 120 and 122 are set substantially similarly in the embodiments described above, it is also good to set them in different shapes. For example, it can be also performed to set the number of turns of the lower conductor 122 to be more than that of the upper conductor 120. Thus, since the upper conductor 120 does not directly face the semiconductor substrate 110 if all or part of the lower conductor 122 is arranged under the upper conductor 120, it is possible to effectively prevent the generation of eddy currents due to the upper conductor 120.

In addition, although the inductor elements 30, 30A are formed by forming two conductors 120 and 122 on the semiconductor substrate 110 in the embodiments described above, the inductor element in which two conductors 120 and 122 are formed on a conductor substrate such as a metal is also realizable. From the experimental result shown in FIG. 10, it is confirmed that, even in this case, this effectively functions as the inductor element and that the LC oscillator performs oscillating. If it becomes possible to form the inductor elements 30, 30A by closely contacting them on a conductor substrate, it also becomes possible to arrange the inductor elements 30, 30A on a front side of a metal shielding case or the like. Hence it becomes easy to secure an installation space of the inductor element.

In addition, in the inductor elements 30 and 30A in respective embodiments described above, each connecting wire 134 different from the lead wires 130 and 132 is used for mutually connecting both odd ends of the two conductors 120 and 122. Nevertheless, as shown in FIG. 18, it is also good to mutually connect both odd ends of the two conductors 120 and 122 with using a part of one lead wire 132. In this case, the connecting wire 134 becomes unnecessary. Hence it becomes possible to simplify structure, and further, to improve characteristics since it is prevented that unnecessary magnetic flux by the connecting wire 134 is generated, and that effective magnetic flux generated by the inductor conductor is disturbed.

Furthermore, although a Clapp circuit is used as an LC oscillator in the embodiments described above, it is also good to use another LC oscillator such as a Colpitts circuit that makes oscillating operation, where the resonance of an inductor and a capacitor is used, performed. Even in this case, by using an inductor element having the structure shown in FIG. 2 etc. as an inductor element included in the LC oscillator, it is possible to realize an LC oscillator which performs oscillating operation on a semiconductor substrate or a conductor substrate.

INDUSTRIAL APPLICABILITY

As described above, according to the present invention, a conductor that is one of two conductors, both odd ends of which are mutually connected, and is apart from a substrate is used as an inductor conductor, and a lead wire of this inductor conductor passes between another conductor, being near to the substrate, and the substrate. Hence it is possible to suppress to the minimum the interruption of the flow of effective magnetic flux generated by the inductor conductor. Therefore, with using this inductor element as a part of an LC oscillator, the LC oscillator that is having good characteristics can be formed on the substrate, and oscillation can be performed.

In addition, according to the present invention, electric current flows also to another conductor by effective magnetic flux generated by the inductor conductor. Nevertheless, by terminating the free end of this other conductor by an impedance element, it becomes possible to prevent unnecessary reflection in this portion, and hence, to improve characteristics of the inductor element. Therefore, it is possible to form an LC oscillator having further good characteristics on a substrate.

What is claimed is:

1. An LC oscillator using an inductor element formed on a substrate, characterized in that the inductor element has two conductors that are formed in piles on the substrate in the state where they are mutually insulated, and are connected at both odd ends, and wherein one of the conductors apart from the substrate is used as an inductor conductor, and a lead wire of this inductor conductor is located so as to pass between another one of the conductors, being near the substrate, and the substrate.

2. The LC oscillator according to claim 1, characterized in at that in the inductor element the two conductors and the lead wire are formed respectively with using metal layers, which are different layers being mutually apart by one or more layers, in the three or more layers of metal layers that are formed on the substrate.

3. The LC oscillator according to claim 1, characterized in that the inductor element mutually connects both odd ends of the two conductors with using a part of the lead wire.

4. The LC oscillator according to claim 1, characterized in that the substrate is a semiconductor substrate, and components are formed on the substrate in which the inductor element is formed.

5. The LC oscillator according to claim 1, characterized in that the two conductors have substantially the same shape.

6. The LC oscillator according to claim 1, characterized in that the two conductors have long shapes, and one end of one conductor in a longitudinal direction is connected with one end of the other in the longitudinal direction.

7. The LC oscillator according to claim 1, characterized in that the two conductors have circular shapes less than one turn, and one end of one conductor is connected with one end of the other.

8. The LC oscillator according to claim 1, characterized in that the two conductors have spiral shapes each number of turns of which is one or more, and one end of one conductor is connected with one end of the other.

9. The LC oscillator according to claim 1, characterized in that the two conductors each have a spiral shape of one or more turns, mutually connect both odd ends, and also makes the lead wire, led out from the inner circumferential end of the inductor conductor, pass between the other conductor and the substrate.

10. The LC oscillator according to claim 1, characterized in that the two conductors are formed in substantially linear shapes, and one end of one conductor is connected with one end of the other.

11. The LC oscillator according to claim 1, characterized in that the two conductors are formed in meander shapes, and one end of one conductor is connected with one end of the other.

12. The LC oscillator according to claim 8, characterized in that an inner end of said one conductor is connected with an outer end of the other conductor.

13. The LC oscillator according to claim 1, characterized in that the inductor element has an inductance component of the conductor of an upper layer, and a capacitance component between the two conductors.

14. An LC oscillator using an inductor element formed on a substrate, characterized in that the inductor element has two conductors that are formed in piles on the substrate in the state where they are mutually insulated, and are mutually connected at both odd ends, and wherein one of the conductors apart from the substrate is used as an inductor conductor, and further, an end that is an end of another one of the conductors and is not connected to the inductor conductor is terminated with a predetermined impedance element.

15. The LC oscillator according to claim 14, characterized in that it is possible to change at least one device constant of a resistor, a capacitor,and an inductor in the impedance element, and termination conditions are changed by making the device constant variable.

16. The LC oscillator according to claim 15, characterized in that the substrate is a semiconductor substrate, and the capacitor is formed of a variable capacitance diode made of a semiconductor layer formed in the inside or outside of the semiconductor substrate.

17. The LC oscillator according to claim 15, characterized in that the substrate is a semiconductor substrate, and the resistor is formed of a channel of an FET made of a semiconductor layer formed in the inside or outside of the semiconductor substrate.

18. The LC oscillator according to claim 14, characterized in that the substrate is a semiconductor substrate, and components are formed on the substrate in which the inductor element is formed.

19. The LC oscillator according to claim 14, characterized in that the two conductors have substantially the same shape.

20. The LC oscillator according to claim 14, characterized in that the two conductors have long shapes, and one end of one conductor in a longitudinal direction is connected with one end of the other in the longitudinal direction.

21. The LC oscillator according to claim 14, characterized in that the two conductors have circular shapes less than one turn, and one end of one conductor is connected with one end of the other.

22. The LC oscillator according to claim 14, characterized in that the two conductors have spiral shapes each number of turns of which is one or more, and one end of one conductor is connected with one end of the other.

23. The LC oscillator according to claim 14, characterized in that the two conductors are formed in substantially linear shapes, and one end of one conductor is connected with one end of the other.

24. The LC oscillator according to claim 14, characterized in that the two conductors are formed in meander shapes, and one end of one conductor is connected with one end of the other.

25. The LC oscillator according to claim 22, characterized in that an inner end of said one conductor is connected with an outer end of the other conductor.

26. The LC oscillator according to claim 14, characterized in that the inductor element has an inductance component of the conductor of an upper layer, and a capacitance component between the two conductors.

* * * * *